United States Patent
Yu et al.

(10) Patent No.: US 7,249,304 B2
(45) Date of Patent: Jul. 24, 2007

(54) APPARATUS AND METHOD FOR ERROR CORRECTION IN A CDMA MOBILE COMMUNICATION SYSTEM

(75) Inventors: Nam-Yul Yu, Suwon-shi (KR); Min-Goo Kim, Suwon-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 479 days.

(21) Appl. No.: 10/727,625

(22) Filed: Dec. 5, 2003

(65) Prior Publication Data

US 2004/0153940 A1    Aug. 5, 2004

(30) Foreign Application Priority Data

Dec. 10, 2002    (KR) ............... 10-2002-0078523

(51) Int. Cl.
*G06F 11/00* (2006.01)

(52) U.S. Cl. .............. 714/755; 714/704; 714/753; 714/798

(58) Field of Classification Search ........... 714/755, 714/704, 702, 762, 788, 786, 787, 794, 798, 714/791
See application file for complete search history.

(56) References Cited

U.S. PATENT DOCUMENTS

| | | | |
|---|---|---|---|
| 6,745,352 B2 * | 6/2004 | Cheng | 714/704 |
| 6,829,313 B1 * | 12/2004 | Xu | 375/341 |
| 6,871,303 B2 * | 3/2005 | Kawahara et al. | 714/702 |

FOREIGN PATENT DOCUMENTS

| | | |
|---|---|---|
| GB | 2374500 | 10/2002 |
| WO | 03015288 | 2/2003 |

* cited by examiner

*Primary Examiner*—Guy Lamarre
*Assistant Examiner*—Fritz Alphonse
(74) *Attorney, Agent, or Firm*—Roylance, Abrams, Berdo & Goodman, L.L.P.

(57) ABSTRACT

An FEC apparatus and method is provided that uses turbo codes. An input frame is iteratively decoded until an iterative decoding stop command is received under a predetermined control, and the absolute reliability of each symbol in the frame is output. The minimum of the absolute reliabilities is detected as a measurement, and a threshold is detected using the a-priori information and extrinsic information of the each symbol. The measurement is compared with the threshold, and the iterative decoding stop command is output according to the comparison result.

6 Claims, 7 Drawing Sheets

APPARATUS AND METHOD FOR ERROR CORRECTION IN A CDMA MOBILE COMMUNICATION SYSTEM

PRIORITY

This application claims priority under 35 U.S.C. § 119 to an application entitled "Apparatus and Method for Error Correction in a CDMA Mobile Communication System" filed in the Korean Industrial Property Office on Dec. 10, 2002 and assigned Ser. No. 2002-78523, the contents of which are incorporated herein by reference.

BACKGROUND OF THE INVENTION

1. Field of the Invention

The present invention relates generally to an apparatus and method for providing error correction in a code division multiple access (CDMA) mobile communication system, and in particular, to an apparatus and method for providing forward error correction (FEC) using turbo codes.

2. Description of the Related Art

A conventional CDMA mobile communication system corrects errors caused by noise in a transport channel. FEC is a technique for encoding an information codeword using an error correction method at a transmitter and recovering the information codeword by decoding the received codeword at a receiver. Major FEC techniques currently being used are convolutional coding and turbo coding.

Turbo codes have recently been adopted as error correction codes in both $3^{rd}$ generation synchronous and asynchronous mobile communication systems. It is known that the turbo codes offer a higher performance gain than the convolutional codes which have been widely used. Besides, the turbo codes are effective in correcting noise-incurred errors and as a result, increase data transmission reliability.

A turbo encoder is configured such that it generates parity symbols from an input frame having L information bits using two simple parallel concatenated codes. It uses recursive systematic convolutional (RSC) codes as component codes. Thus, turbo codes are generated by concatenating two RSC encoders using an interleaver. For turbo decoding, soft input soft output (SISO) decoders for the respective component codes are concatenated in parallel. Extrinsic information output from the SISO decoders is exchanged for iterative decoding. Timing to stop the iterative decoding, and maintain decoding performance is a significant factor that determines the power consumption of the turbo decoder and the time delay involved with the decoding. In other words, an error check must be performed often on a frame during decoding, usually using cyclic redundancy check (CRC) bits in order to shorten the decoding time and minimize the power consumption. Specifically, the transmitter attaches CRC bits to each frame input to the turbo encoder, and the receiver detects errors from a decoded frame using CRC bits in each decoding iteration. If the frame turns out normal, the decoding is no longer performed for the frame.

Now a description will be made of criterions to stop iterative decoding (hereinafter, referred to as stopping criterions).

The stopping criterions must satisfy Condition 1.

Condition 1: Stop decoding iterations if $M(i)>T(i)$ or $M(i)=T(i)$ at any SISO decoder in an $i^{th}$ iteration.

In Condition 1, $M(i)$ is a measurement representing the performance of a turbo decoding frame in the $i^{th}$ decoding iteration, and $T(i)$ is a threshold predetermined or determined in the $i^{th}$ decoding iteration, to be compared with the measurement to determine whether the decoded frame has errors or not. If Condition 1 is satisfied in the comparison, the decoding is stopped in the $i^{th}$ decoding iteration. Each full iteration consists of 2 sequential half iterations, one in each SISO decoder of a turbo decoder.

Stopping criterions proposed so far for iterative decoding will be described below.

(1) Genie-Aided Stopping Criterion

A kind of simulator, Genie monitors iterative decoding in a turbo decoder, compares an output decoded information codeword from a SISO decoder with transmitted information and stops the decoding when no errors are detected in the comparison. This method is viable only in a simulation because it presupposes an ideal test environment. Hence the Genie-aided stopping criterion stands as an ideal for other stopping criterions. The Genie-aided Stopping Criterion is represented as Condition 2.

Condition 2: Stop decoding iterations if $M(i)=T(i)$ at any SISO decoder in an $i^{th}$ iteration.

In Condition 2, a measurement $M(i)$ is the number of different bits between a transmitted frame and a decoded frame at any SISO decoder in the $i^{th}$ iteration, and a threshold $T(i)$ is 0.

(2) CRC Check Stopping Criterion

A frame input to a turbo encoder contains CRC bits for error detection so that the presence or absence of errors in the frame after turbo decoding can be reported to a higher layer in the CDMA mobile communication system. The capability of detecting errors in a frame makes a CRC check feasible as a stopping criterion. A CRC check detects errors from an input frame during iterative decoding in a turbo decoder and if the frame turns out normal, the decoding iterations are stopped. The CRC Stopping Criterion is represented as Condition 3.

Condition 3: Stop decoding iterations if $M(i)=T(i)$ at any SISO decoder in an $i^{th}$ iteration.

In Condition 3, $M(i)$ represents a CRC check output for a decoded frame at any SISO decoder in the $i^{th}$ iteration and $T(i)$ is 0.

The CRC Stopping Criterion, however, has the shortcomings that CRC-caused overhead is imposed on each frame and if an input frame segment does not have CRC bits, it cannot be decoded based on the CRC stopping criterion. For example, when two or more code units are used in a high speed downlink packet access (HSDPA) communication system of a universal mobile telecommunication system (UMTS), CRC bits are not always present in a code unit. In this sense, the CRC Stopping Criterion is not suitable for turbo decoding.

(3) Approximated Cross Entropy Stopping Criterion

Generally, the cross entropy (CE) between two probability distributions can be used as a measurement representing the probabilistic closeness between them. Hagenauer defines and simplifies the CE using Log Likelihood Ratio (LLR) as a measurement for a stopping criterion in a turbo decoder. If the measurement decreases and thus the probabilistic closeness between SISO decoder outputs becomes substantially great, decoding is stopped.

The Approximated Cross Entropy Stopping Criterion is represented as Condition 4.

Condition 4: Stop decoding iterations if $M(i)<T(i)$ at any SISO decoder in an $i^{th}$ iteration.

In Condition 4, $$M(i) = \sum_k \frac{|L_1^{(i)}(u_k) - L_2^{(i-1)}(u_k)|^2}{\exp(|L_2^{(i-1)}(u_k)|)}$$

at a first SISO decoder, or $$M(i) = \sum_k \frac{|L_2^{(i)}(u_k) - L_1^{(i)}(u_k)|^2}{\exp(|L_1^{(i)}(u_k)|)}$$

at a second SISO decoder. T(i) is between $10^{-2}$ and $10^{-4}$.

The Approximated Cross Entropy Stopping Criterion requires $\exp(\cdot)$ operation at each SISO decoder, thereby increasing hardware complexity.

(4) Hard Decision Aided (HDA) Stopping Criterion

Information codewords output from two SISO decoders are compared in each decoding iteration. If there is no difference between them, the decoding is stopped. The HDA Stopping Criterion is represented as Condition 5.

Condition 5: Stop decoding iterations if M(i)>T(i) at any SISO decoder in an $i^{th}$ iteration.

In Condition 5, M(i) is the number of different bits between decoded information frames in the $i^{th}$ and (i−0.5)th iterations and T(i) is 0.

Due to comparisons between a previous SISO decoder output and a current SISO decoder output, the HDA Stopping Criterion requires an additional memory for storing the previous SISO decoder output.

(5) Minimum Absolute LLR (MAL) Stopping Criterion

A novel stopping criterion has been created by approximating a measurement used in the Approximated Cross Entropy Stopping Criterion of Hagenauer, $$\sum_k \frac{|\Delta L e_v^i(\hat{u}_k)|^2}{\exp(|L_1^{(i)}(\hat{u}_k)|)} \approx K \cdot \exp(_k^{-\min}(|L_1^{(i)}(\hat{u}_k)|)) \quad (1)$$

The MAL Stopping Criterion is represented as Condition 6.

Condition 6: Stop decoding iterations if $M(i) > T_1(i)$ and $M(i) > T_2(i)$ at any SISO decoder in an $i^{th}$ iteration.

In Condition 6, $M(i) =_k^{m \ min}(|L_1^{(i)}(\hat{u}_k)|)$ at a $v^{th}$ SISO decoder in the $i^{th}$ iteration. $T_1(i) =_{j<i}^{m \ min} M(j) + T_f$ and $T_2(i) = M_1 + T_d$.

In accordance with the MAL Stopping Criterion, a minimum absolute LLR output from a SISO decoder is set as a measurement. A measurement set in the previous iteration is used as a threshold in the current iteration. While the Approximated Entropy Stopping Criterion and the HDA Stopping Criterion use information from two SISO decoders, the MAL Stopping Criterion can stop decoding iterations only using information from the current SISO decoder. As a result, performance may be degraded in terms of frame error rate (FER). To minimize the performance degradation, $T_f$ and $T_d$ for the first and second thresholds $T_1(i)$ and $T_2(i)$ are empirically obtained from a simulation. The thresholds are adaptively used to reduce performance independency of frame size or SNR (Signal to Noise Ratio). Yet, the adaptive use of the thresholds increases the average number of decoding iterations. In other words, an increase in the number of decoding iterations must be suffered to prevent FER performance degradation.

(6) Sign Difference Ratio (SDR) Stopping Criterion

The HDA Stopping Criterion compares information codewords from first and second SISO decoders in a turbo decoder in each half iteration and stores an output information codeword from the previous SISO decoder when the current SISO decoder completes decoding. Therefore, the HDA Stopping Criterion needs an additional memory. To remove the additional hardware implementation, the SDR Stopping Criterion has been proposed. Instead of comparing an information codeword from the current SISO decoder with that from the previous SISO decoder, the signs of a-priori information and extrinsic information for a frame in one SISO decoder are compared, and decoding is stopped according to the number of different signs.

The SDR Stopping Criterion is represented as Condition 7.

Condition 7: Stop decoding iterations if M(i)<T(i) at any SISO decoder in an $i^{th}$ iteration.

In Condition 7, M(i) is the number of different signs between a-priori information and extrinsic information for a decoded information frame at any SISO decoder in the $i^{th}$ iteration and T(i) is p.

Since a-priori information and extrinsic information are converged more slowly than LLR information, the SDR Stopping Criterion with p=0 has a greater average number of decoding iterations than the HDA Stopping Criterion. Though the average number of decoding iterations is decreased by increasing p, FER performance degradation results.

Among the above-described Stopping Criterions, the HDA Stopping Criterion has relatively excellent FER performance. Despite this advantage, requires an additional memory for storing an information codeword from a previous SISO decoder. The SDR Stopping Criterion obviates the need for the additional memory because it compares the signs of input a-priori information and output extrinsic information at a SISO decoder. Depending on a threshold, however, FER performance is degraded, or the average decoding iteration number increases, thereby increasing power consumption. The MAL Stopping Criterion offers relatively excellent performance using a easily computed minimum absolute LLR. Yet, it also has the distinctive shortcoming that FER performance varies depending on a threshold. Accordingly, there is a need for creating a novel stopping criterion using a simply set threshold, for stopping decoding iterations.

SUMMARY OF THE INVENTION

It is, therefore, an object of the present invention to provide an error correction apparatus and method for efficiently stopping decoding iterations in a CDMA mobile communication system.

It is another object of the present invention to provide an error correction apparatus and method for minimizing hardware in a CDMA mobile communication system.

It is a further object of the present invention to provide an error correction apparatus and method for minimizing the volume of computation in software for a CDMA mobile communication system.

The above objects are substantially accomplished by an FEC apparatus and method using turbo codes. In the FEC apparatus, a decoder is adapted to iteratively decode an input frame until an iterative decoding stop command is received under a predetermined control, and output the absolute reliability of each symbol in the frame. A measurement detector is adapted to detect the minimum of the absolute reliabilities as a measurement. The apparatus further provides a threshold detector adapted to detect a threshold using a-priori information and extrinsic information of each symbol. A controller is also adapted to compare the measurement with the threshold and output the iterative decoding stop command according to the comparison result.

In the FEC method, an input frame is iteratively decoded until an iterative decoding stop command is received under a predetermined control, and the absolute reliability of each symbol in the frame is output. The minimum of the absolute reliabilities is detected as a measurement, and a threshold is detected using the a-priori information and extrinsic information of the each symbol. The measurement is compared with the threshold and the iterative decoding stop command is output according to the comparison result.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

Several embodiments of the present invention will be described herein below with reference to the accompanying drawings. In the following description, well-known functions or constructions will be omitted for conciseness.

To reflect the convergence speed of actual LLRs in a measurement M(i) applied to a stopping criterion in an FEC apparatus using turbo codes in a CDMA mobile communication system, the present invention provides an SDML Stopping Criterion that adopts a measurement as applied to the MAL Stopping Criterion as M(i).

The SDML Stopping Criterion is defined as

Condition 8: Stop decoding iterations if $M(i) > T(i)$ at any SISO decoder in an $i^{th}$ iteration.

In Condition 8, a measurement $M(i) = {}_k^{min}(|L_v^{(i)}(\hat{u}_k)|)$ at a $v^{th}$ SISO decoder in the $i^{th}$ iteration, and a threshold $T(i)$ is the number of different signs between input a-priori information and output extrinsic information for a decoded information frame at the $v^{th}$ SISO decoder in the $i^{th}$ iteration. The signs of a-priori information and extrinsic information for each symbol in a decoded information frame at the $v^{th}$ SISO decoder are compared and the number of different signs is set as $T(i)$. A variable k is the index of each symbol in the frame.

The SDML Stopping Criterion provides FER performance and an average number of decoding iterations almost equal to those of the conventional HDA Stopping Criterion in a turbo decoder. While the latter requires an additional memory for storing an information codeword from a previous SISO decoder to be compared with an information codeword from a current SISO decoder, the former provides almost the same performance without using an additional memory.

Figure 1:
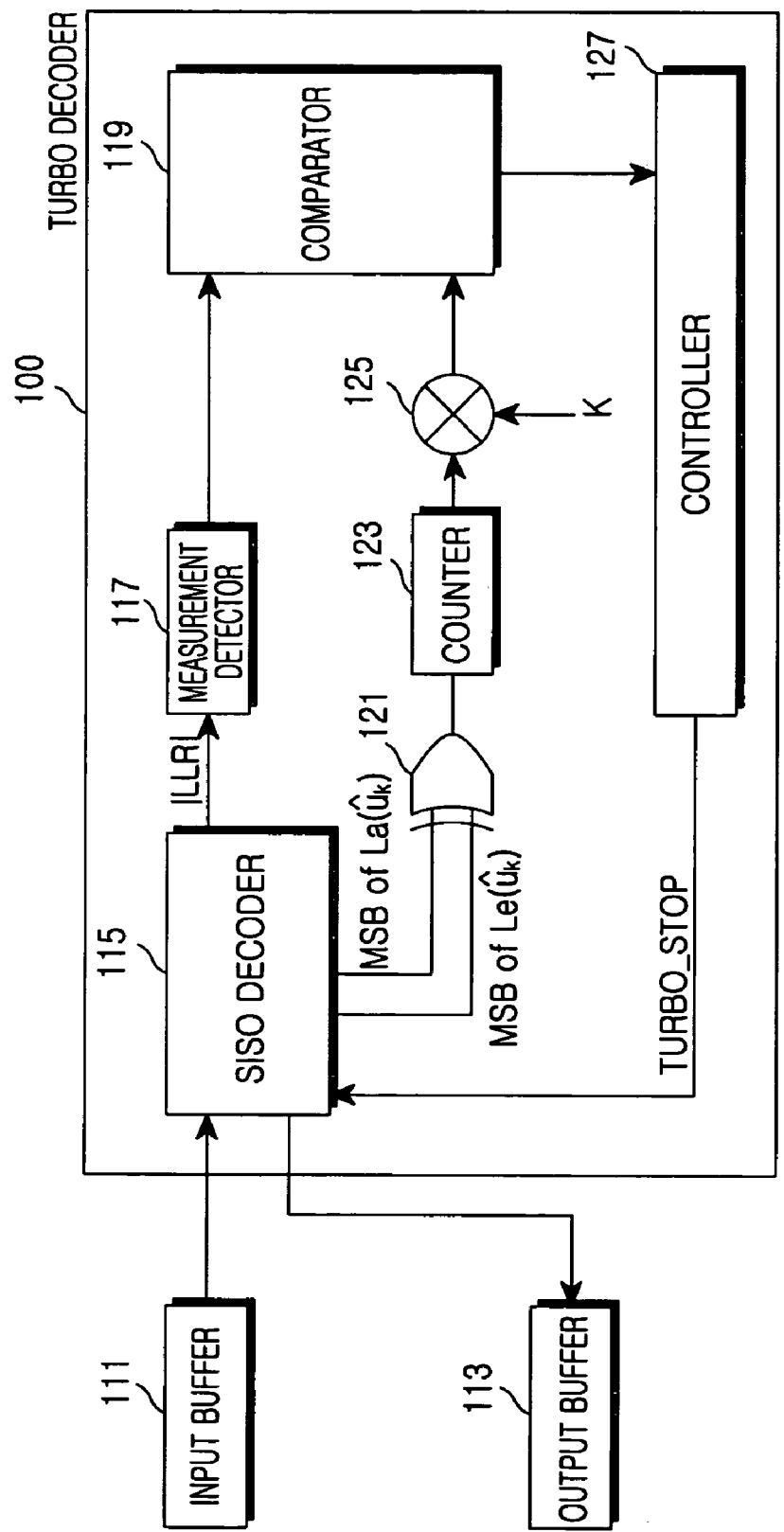
FIG. 1 is a block diagram of an example of a turbo decoder to which the present invention is applied according to an embodiment of the present invention.

The structure of a turbo decoder relying on the SDML Stopping Criterion will be described below with reference to FIG. 1. FIG. 1 is a block diagram of an example of the turbo decoder to which the present invention is applied according to an embodiment of the present invention.

Referring to FIG. 1, a turbo decoder 100 is comprised of a SISO decoder 115, a measurement detector 117, a comparator 119, an OR gate 121, a counter 123, a multiplier 125, and a controller 127.

An input buffer 111 buffers an input frame to the turbo decoder and outputs it to the SISO decoder 115 on a symbol basis. The SISO decoder 115 decodes a received symbol and provides an output information codeword to an output buffer 113. Substantially simultaneously, the SISO decoder 115 provides the absolute LLR (|LLR|) of the symbol to the measurement detector 117. The output buffer 113 buffers the information codeword for the symbol. The measurement detector 117 receives absolute LLRs from the SISO decoder 115 and detects a measurement M(i) as being the minimum absolute LLR (minimum |LLR|) from the absolute LLRs. An embodiment of the present invention provides M(i) as a minimum absolute |LLR|.

Meanwhile, the SISO decoder 115 outputs a-priori information $La(\hat{u}_k)$ and extrinsic information $Le(\hat{u}_k)$ for the input $k^{th}$ symbol to the OR gate 121. The OR gate 121 performs a logical OR-operation on the signs of the a-priori information $La(\hat{u}_k)$ and extrinsic information $Le(\hat{u}_k)$. The counter 123 counts the number of 1s in the output of the OR gate 121. The multiplier 125 multiplies the count with a constant K. The reason for counting the number of 1s is that the OR gate 121 outputs 0 when the signs of the a-priori information $La(\hat{u}_k)$ and extrinsic information $Le(\hat{u}_k)$ are the same and 1 when they are different. In other words, T(i) is the number of different signs between a-priori information and extrinsic information. The constant K is a value by which a difference possibly involved with quantization or scaling of an input symbol is compensated for.

The comparator 119 compares the $M(i)(= {}_k^{min}(|L_v^{(i)}(\hat{u}_k)|))$ received from the measurement detector 117 with a T(i) received from the multiplier 125. The controller 127 determines whether to stop decoding iterations according to the comparison result. If $M(i) > T(i)$, the controller 127 stops the decoding and then provides an iterative decoding stop command TURBO_STOP to the SISO decoder 115. The SISO decoder 115 responsively stops the iterative decoding.

Figure 2:
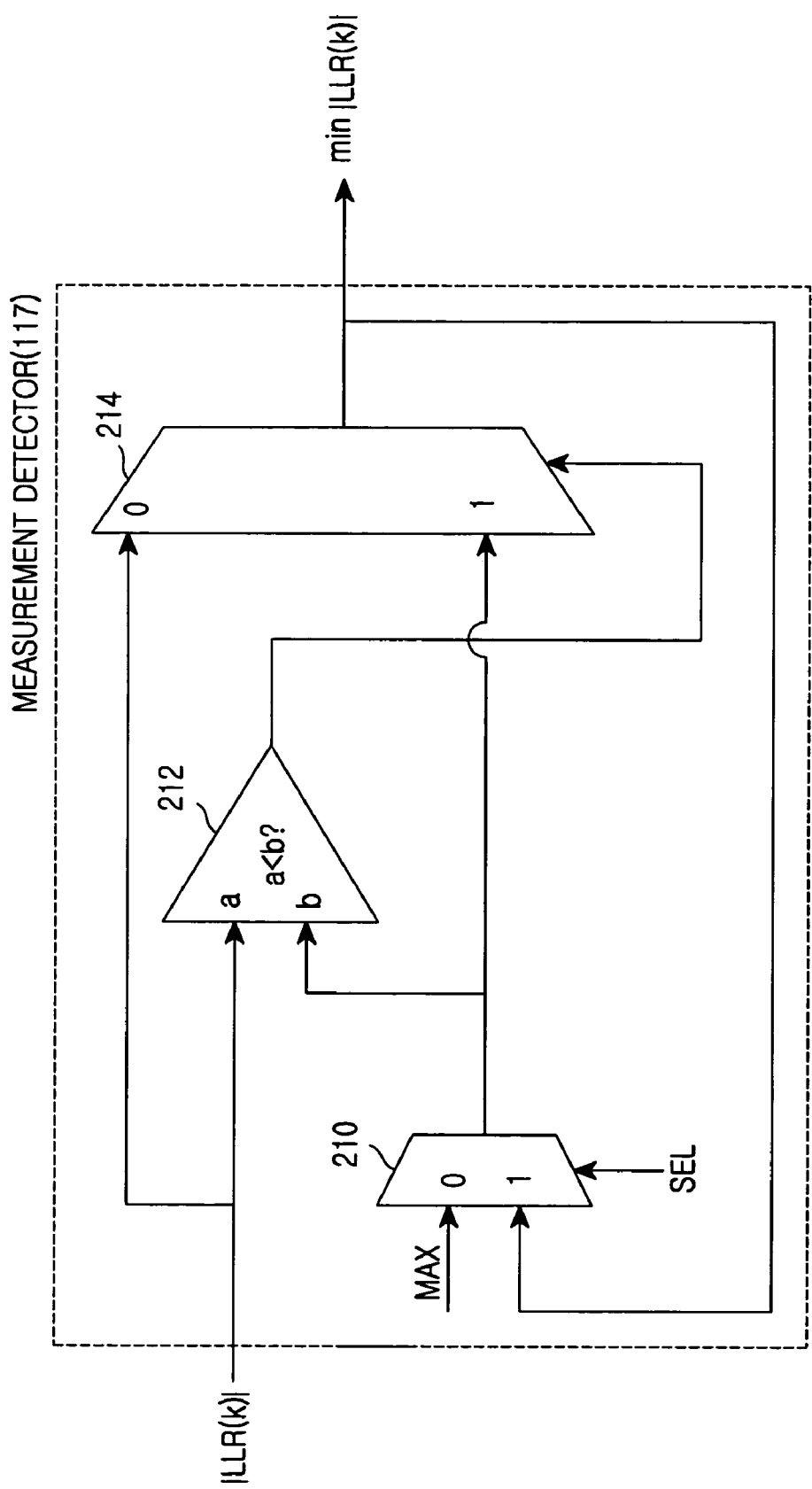
FIG. 2 is a block diagram of an example of a measurement detector 117 illustrated in FIG. 1 according to an embodiment of the present invention.

FIG. 2 is a block diagram of an example of the measurement detector 117 according to an embodiment of the present invention. Referring to FIG. 2, the measurement detector 117 detects a minimum absolute |LLR| for a decoded information frame. The measurement detector is configured with the use of comparators and a selector.

Referring to FIG. 2, a first selector 210 selects one of an initial maximum value MAX received from the controller 127 and M(i) received from the measurement detector 117 according to a select signal SEL from the controller 127. The controller 127 initially provides a select signal SEL that provides a choice of the maximum value MAX and later a select signal SEL that provides a choice of M(i). That is, the select signal SEL is 0 for the first symbol and then 1 for the other symbols. A comparator 212 receives the output of the first selector 210 and an LLR |LLR(k)| from the SISO decoder 115 as (a, b) and selects one of them. Here, LLR(k) denotes the LLR of a $k^{th}$ symbol in the frame. If a<b, the comparator 212 outputs 1, Otherwise, it outputs a 0. A second selector 214 receives |LLR(k)| and the output of the first selector through input ports 0 and 1, respectively and selects one of them as M(i) according to the output of the comparator 212. For example, if the output of the comparator 212 is 1, the second selector 214 selects the input of port 1. The measurement detector 117 illustrated in FIG. 2 sets an initial register value to MAX, updates the register value while comparing |LLR| of each symbol in the frame with the register value, and outputs a final register value as M(i).

Now a description will be made of turbo decoding relying on the SDML Stopping Criterion in connection with FIG. 3.

Figure 3:
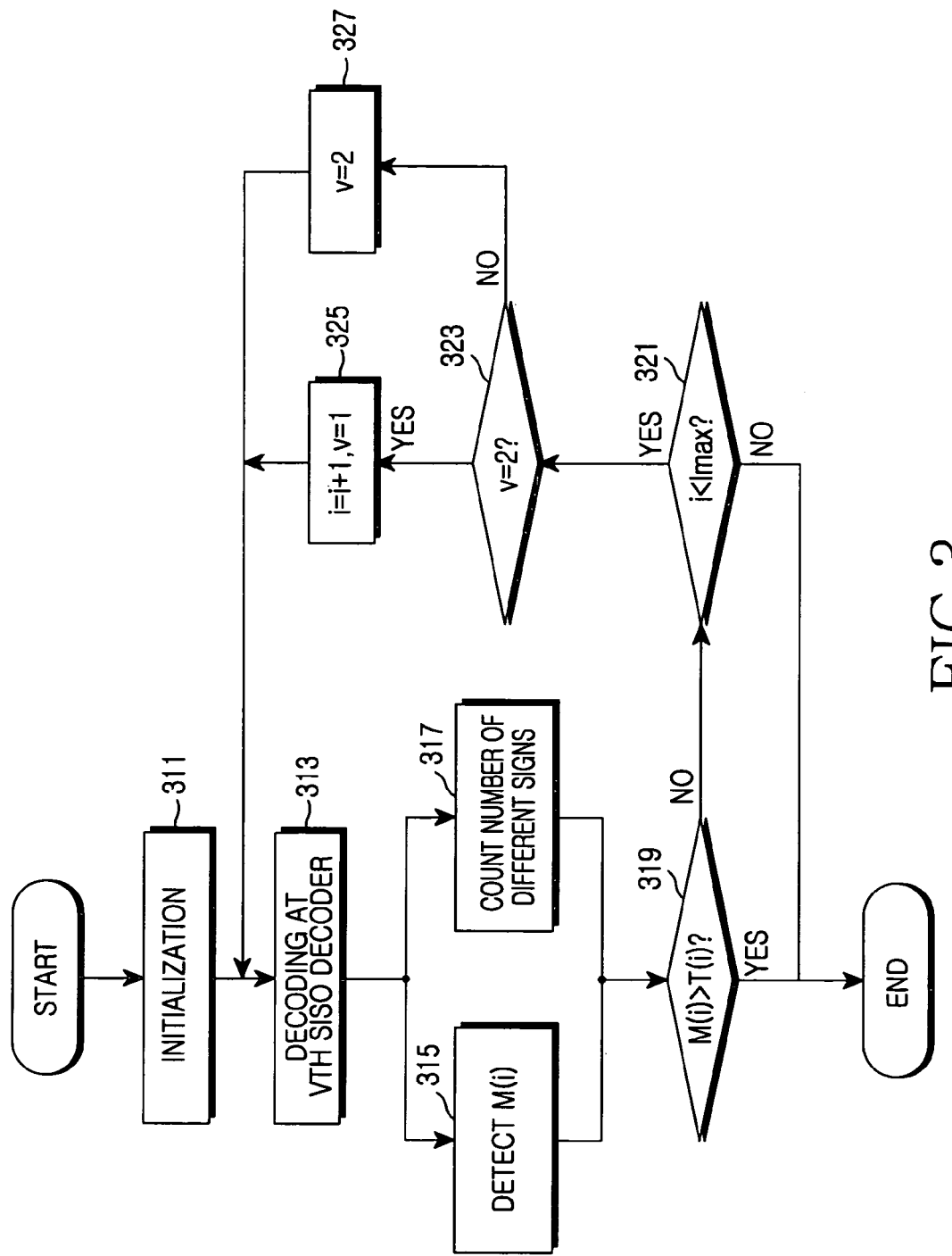
FIG. 3 is a flowchart illustrating an example of steps for performing turbo decoding based on a sign difference & minimum absolute LLR (SDML) Stopping Criterion according to an embodiment of the present invention.

FIG. 3 is a flowchart illustrating an example of steps for performing turbo decoding based on a sign difference & minimum absolute LLR (SDML) Stopping Criterion e.g., turbo decoding based on the SDML Stopping Criterion according to an embodiment of the present invention.

Referring to FIG. 3, before a first decoding iteration for an input frame, the controller 127 sets M(i) and T(i) to their initial values 0, sets variables i and v to their initial values 1, and sets a maximum iteration number Imax in step 311. The variables i and v denote the number of decoding iterations and a decoder number, respectively. For example, if v is 1, it indicates a first SISO decoder and if v is 2, it indicates a second SISO decoder. In step 313, the controller 127 controls an $i^{th}$ iteration to run at a $v^{th}$ SISO decoder. The $v^{th}$ SISO decoder detects M(i) in the $i^{th}$ iteration and outputs it to the comparator 119 in step 316. Meanwhile, the OR gate 121 performs a logical OR-operation on the signs of a-priori information La($\hat{u}_k$) and extrinsic information Le($\hat{u}_k$)resulting from the $i^{th}$ iteration. The counter 123 counts the number of 1s in the output of the OR gate 121 in step 317. The multiplier 125 computes T(i) by multiplying the count with a constant K.

In step 319, the comparator 119 compares M(i) with T(i). If M(i)>T(i), the controller 127 stops the iterative decoding by outputting an iterative decoding stop command TURBO_STOP to the SISO decoder 115 when the SDML Stopping Criterion is satisfied and terminates the procedure. On the contrary, if M(i)≦T(i), the controller 127 proceeds to step 321 to continue the iterative decoding.

In step 321, the controller 127 compares i with Imax. If i is equal to or greater than Imax, which implies that the iterative decoding cannot be performed any more, the controller 127 outputs the iterative decoding stop command TURBO_STOP to the SISO decoder 115 and terminates the procedure. On the contrary, if i is less than Imax, the controller 127 checks whether v is 1 in step 323. If v is 2, the controller 127 increases i to i+2 and sets v to 1 in step 325 and returns to step 313. If v is not 2, the controller 127 sets v to 2 in step 327 and returns to step 313.

Simulated turbo decoding based on the SDML Stopping Criterion will now be compared with simulated turbo decoding based on the conventional stopping criterions. A turbo encoder used in the simulations has a constraint length K of 4 and a code rate R of ⅓ according to the $3^{rd}$ Generation Partnership Project (3GPP) standards, and an RSC transfer function for each constituent encoder is $$G(D) = \left[1, \frac{1+D+D^3}{1+D^2+D^3}\right] \quad (2)$$

Interleaving for turbo encoding also follows the 3GPP standards and binary phase shift keying (BPSK) is preferably adopted as a modulation scheme. Transmission of turbo codewords presupposes an additive white Gaussian noise (AWGN) transmission path.

A turbo decoder for decoding a received frame at a receiver uses a max-Log-MAP-based floating point SISO decoding algorithm, SISO decoders are concatenated serially through an interleaver, and the number of decoding iterations for the frame is preferably limited to 8. A stopping criterion is applied after decoding is completed at each SISO decoder. That is, iterative decoding can be stopped on a half-iteration basis. The SDML Stopping Criterion and the conventional stopping criterions that require thresholds, that is, the Approximated Cross Entropy Stopping Criterion, the MAL Stopping Criterion, and the SDR Stopping Criterion have the following thresholds:

(1) Approximated Cross Entropy Stopping Criterion: T=$10^{-3}$;
(2) MAL Stopping Criterion; $T_r$=5 and $T_d$=5; and
(3) SDR Stopping Criterion; p=0 or 20.

The performances of the SDML Stopping Criterion and the conventional stopping criterions in turbo encoding and turbo decoding will be compared.

Figure 4:
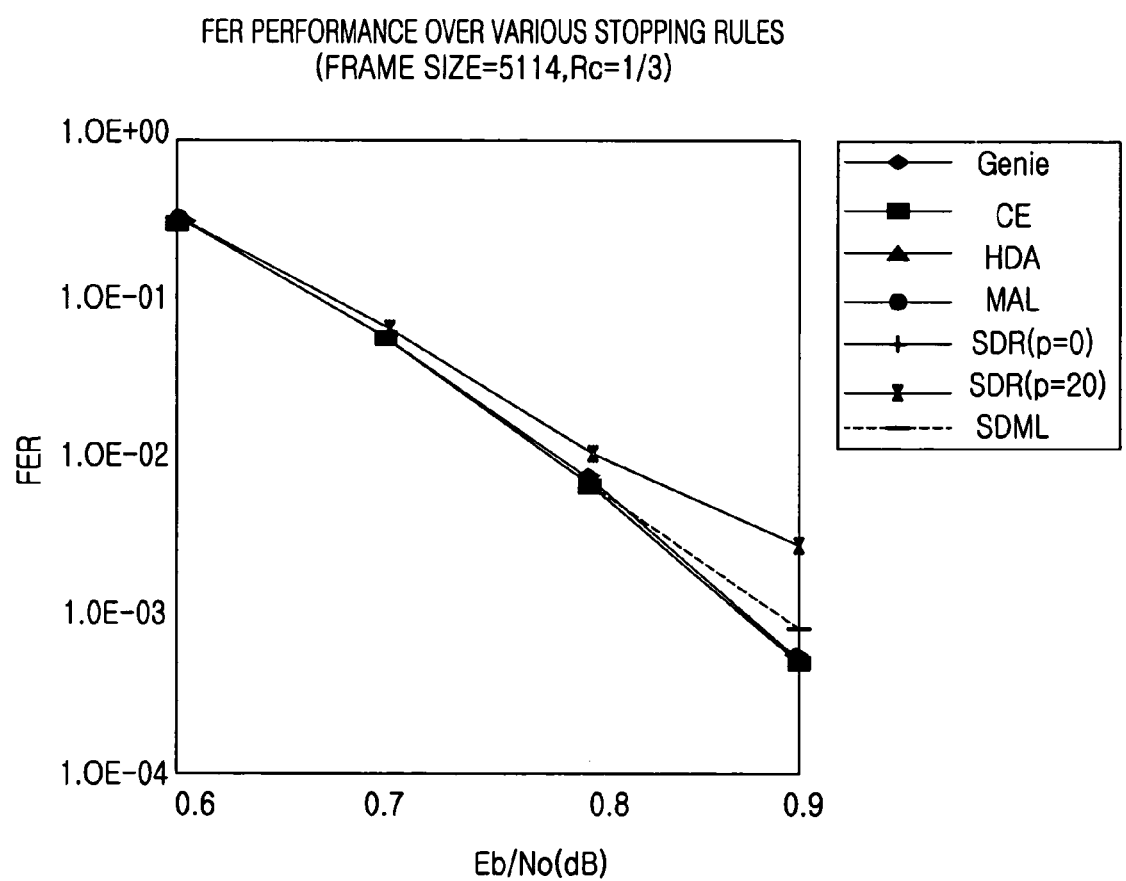
FIG. 4 is a graph illustrating an example of FER performance over the SDML Stopping Criterion and conventional stopping criterions when a frame size is 5114 according to an embodiment of the present invention.

FIG. 4 is a graph illustrating an example of FER performances over the SDML Stopping Criterion and conventional stopping criterions when a frame size is 5114 according to an embodiment of the present invention.

Referring to FIG. 4, the SDR Stopping Criterion with p=20 determines, if the number of different signs between a-priori information and extrinsic information for a frame at a SISO decoder is 20 or less, that the output of the SISO decoder has no errors. Hence, it is possible to reduce an average iteration number in the turbo decoder. However, since errors may be present in the decoded frame in practice, FER performance can be degraded as compared to other stopping criterions. On the other hand, if p=0, since decoding is stopped only when there are no difference in signs between a-priori information and extrinsic information for each bit of a decoder frame at the SISO decoder, the average iteration number is increased but almost the same FER performance as that of the Genie-aided Stopping Criterion is achieved. The SDML Stopping Criterion also causes performance degradation, but to a lesser extent than other stopping criterions, as noted from FIG. 4.

FER performance degradation occurs in both the SDR and SDML Stopping Criterions because they set M(i) and T(i) and take only the output of one SISO decoder into account and determine whether to stop iterative decoding using M(i) and T(i). In view of producing one codeword from two RSCs in the turbo decoder, a decision whether to stop iterative decoding based only on the output of one SISO decoder is equivalent to the use of only half the information required for turbo decoding. Therefore, FER performance is degraded. Meanwhile, although it is based only on the output of one SISO decoder like the SDR and SDML Stopping Criterions, the MAL Stopping Criterion brings about less FER performance degradation because T(i) is set such that the FER performance of the Genie-aided Stopping Criterion is reached.

The HDA Stopping Criterion sets M(i) and T(i), taking the outputs of both first and second SISO decoders into account. Therefore, it has almost the same FER performance as the Genie-aided Stopping Criterion. In addition, the HDA Stopping Criterion requires about one half more iteration, relative to the Genie-aided Stopping Criterion. If a first output information codeword from a SISO decoder has no errors, decoding can be stopped at a corresponding time point in the Genie-aided Stopping Criterion. However, the HDA Stopping Criterion preferably always has to perform one more full SISO decoding. Undetected errors are generated due to the minimum information weight of a turbo code at an FER equal to or less than a predetermined threshold in the HDA Stopping Criterion. Such errors are detected in the Genie-aided Stopping Criterion, but the undetected errors serve as frame errors and yield FER performance degradation in the HDA Stopping Criterion.

As observed from FIG. 4, the HDA and SDML Stopping Criterions offer the best FER performance. The former is similar to the Genie-aided Stopping Criterion in terms of FER performance and average number of iterations. The latter advantageously obviates the need for an additional memory, while providing FER performance and an average iteration number almost the same as those of the HDA Stopping Criterion.

With reference to FIG. 4, the SDML Stopping Criterion has been compared with other conventional stopping criterions in terms of FER performance. Now, they will be described in terms of average number of decoding iterations.

Figure 5:
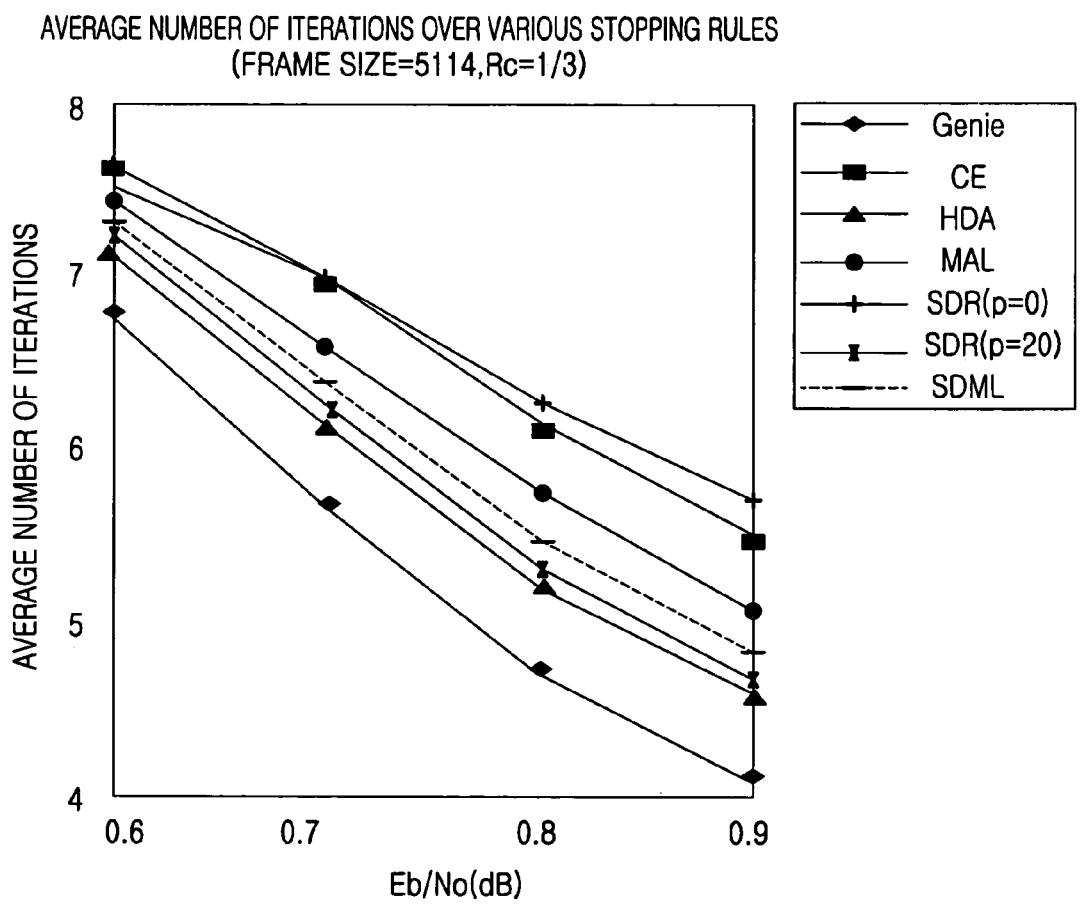
FIG. 5 is a graph illustrating an example of the average number of iterations over the SDML Stopping Criterion and the conventional stopping criterions when the frame size is 5114 according to an embodiment of the present invention.

FIG. 5 is a graph illustrating an example of the average number of iterations over the SDML Stopping Criterion and the conventional stopping criterions when a frame size is 5114 according to an embodiment of the present invention.

Referring to FIG. 5, the SDR Stopping Criterion with p=20 determines, if the number of different signs between a-priori information and extrinsic information for a frame at a SISO decoder is 20 or less, that the output of the SISO decoder has no errors. Hence, it is possible to reduce an average iteration number in the turbo decoder. Therefore, the SDR Stopping Criterion improves performance in the average number of iterations when p=20 rather than when p=0. The SDR Stopping Criterion particularly does not require an additional memory, though it has a similar average iteration number to that of the SDML Stopping Criterion.

With reference to FIGS. 4 and 5, the SDML Stopping Criterion has been compared with other conventional stopping criterions in terms of FER performance and average iteration number when a frame size is 5114. Now, they will be described in terms of FER performance and average number of decoding iterations when the frame size is 2558 (=⌈5115/2⌉).

Figure 6:
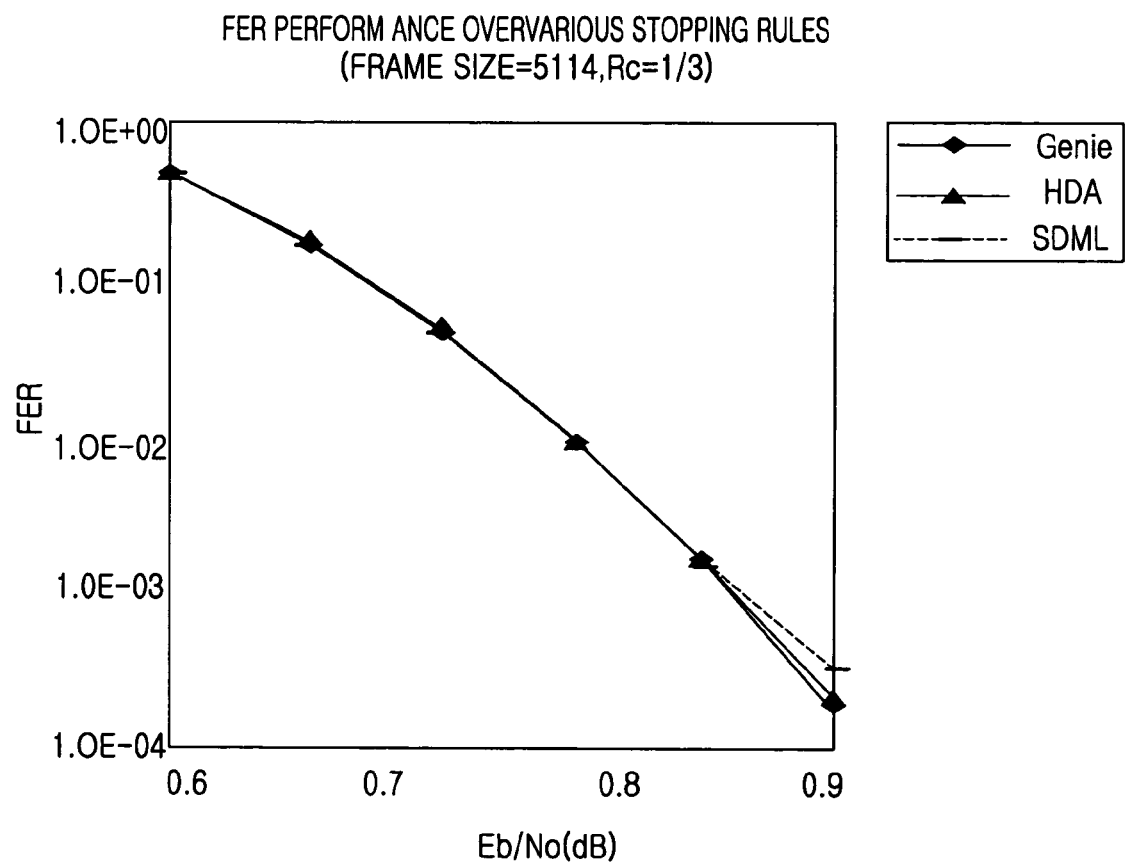
FIG. 6 is a graph illustrating an example of FER performance over the SDML Stopping Criterion and the conventional stopping criterions when a frame size is 2558 according to an embodiment of the present invention.

FIG. 6 is a graph illustrating an example of FER performance over the SDML Stopping Criterion and the conventional stopping criterions when a frame size is 2558 according to an embodiment of the present invention.

Before describing FIG. 6, it should be noted that iterative decoding can be stopped for a frame size between 2558 and 5114 bits using CRC bits in an HSDPA communication system of UMTS. In FIG. 6, the frame size is 2558 bits and. To clarify the difference between the HDA Stopping Criterion and the SDML Stopping Criterion, only the FER performances of the Genie-aided, HDA, and SDML Stopping Criterions are illustrated.

Referring to FIG. 6, the HDA and SDML Stopping Criterions have almost the same FER performance as that of the Genie-aided Stopping Criterion. Therefore, with a small frame size, the SDML Stopping Criterion is optimized such that it has FER performance approximate to that of the Genie-aided Stopping Criterion. Although a slight FER performance degradation is observed in a high Eb/No area in the SDML Stopping Criterion, high Eb/No is not considered and such a low FER is not targeted in the HSDPA communication system. Consequently, the FER performance degradation has little influence on turbo decoding performance.

With reference to FIG. 6, the SDML Stopping Criterion has been compared with the HDA and Genie-aided Stopping Criterions in terms of FER performance. Now, they will be described in terms of average number of decoding iterations.

Figure 7:
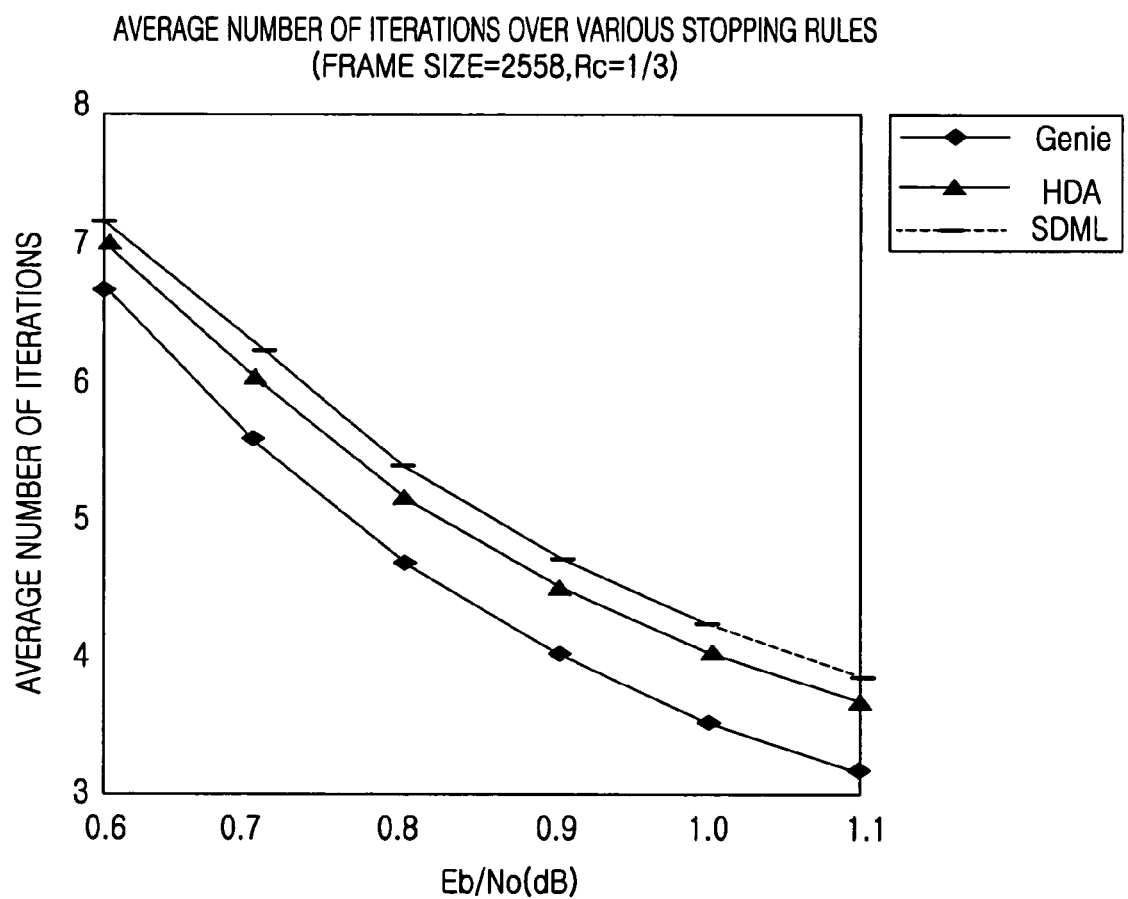
FIG. 7 is a graph illustrating an example of the average number of iterations over the SDML Stopping Criterion and the conventional stopping criterions when the frame size is 2558 according to an embodiment of the present invention.

FIG. 7 is a graph illustrating an example of the average number of iterations over the SDML Stopping Criterion of the present invention and the conventional stopping criterions when a frame size is 2558. To make apparent the difference between the HDA Stopping Criterion and the SDML Stopping Criterion, only the Genie-aided, HDA, and SDML Stopping Criterions are considered here.

Referring to FIG. 7, the HDA and SDML Stopping Criterions exhibit almost the same performance in average iteration number as that of the Genie-aided Stopping Criterion. Therefore, with a small frame size, the SDML Stopping Criterion is optimized such that it has almost the same average number of decoding iterations as that of the Genie-aided Stopping Criterion. As noted, while the HDA and Genie-aided Stopping Criterions are better than the SDML Stopping Criterion in terms of average iteration number, the SDML Stopping Criterion ensures, without an additional memory, a similar performance to that of the Genie-aided Stopping Criterion.

In accordance with the present invention, an FEC apparatus using turbo codes sets as a measurement a minimum absolute LLR for each symbol of an input frame and the number of different signs between a-priori information and extrinsic information for the symbol as a threshold, when a stopping criterion is applied to stop iterative decoding. Therefore, forward errors can be corrected with a minimum number of iterations without using an additional memory, and without FER performance degradation.

While the invention has been shown and described with reference to a certain embodiments thereof, it will be understood by those skilled in the art that various changes in form and details may be made therein without departing from the spirit and scope of the invention as defined by the appended claims.

What is claimed is:

1. A forward error correction apparatus using turbo codes, comprising:

a decoder for iteratively decoding an input frame on a symbol basis until an iterative decoding stop command is received under a predetermined control, and outputting an absolute reliability of symbols in the frame and a-prior information and extrinsic information for the symbols;

a measurement detector for detecting a minimum of the absolute reliabilities as a measurement;

a threshold detector for detecting a threshold comprising a number of different signs of a-priori information and extrinsic information for the symbols wherein the threshold detector comprises an OR gate for performing logical OR-operation on the signs of the a-priori information with the signs of the extrinsic information, a counter for receiving a signal from the OR gate and counting a number of the different signs between the a-priori information and the extrinsic information and a multiplier for multiplying the counted number of different signs from the counter by a compensation value according to quantization of the symbols input to the decoder;

a comparator for comparing the measurement with the threshold; and a controller for receiving a comparison result from the comparator and outputting the iterative decoding stop command according to the comparison result.

2. The forward error correction apparatus of claim 1, wherein the controller is further outputs the iterative decoding stop command if the measurement exceeds the threshold.

3. The forward error correction apparatus of claim 1, wherein the measurement detector further comprises:

a first selector for receiving an initial value and the minimum absolute reliability of the first symbol of the input frame, and selecting at least one of the initial value and the minimum absolute reliability according to a select signal received from the controller;

a comparator for receiving the absolute reliability and the output of the first selector, comparing the absolute reliability with the output of the first selector, and outputting a select signal according to a comparison result; and a second selector receiving the absolute reliability and the output of the first selector, and selecting as the minimum absolute reliability the absolute reliability with the output of the first selector according to the select signal received from the comparator, wherein the minimum absolute reliability is sequentially measured for the symbols of the frame and the minimum absolute reliabilities is selected as the measurement.

4. A forward error correction method using turbo codes, comprising:

iteratively decoding an input frame on a symbol basis until an iterative decoding stop command is received under a predetermined control, and outputting the absolute reliability of symbols in the frame and a-priori information and extrinsic information for the symbols;

detecting a minimum of the absolute reliabilities as a measurement;

detecting a threshold comprising a number of different signs of a-priori information and extrinsic information for the symbols wherein the step of detecting a threshold comprises performing a logical OR-operation on the signs of the a-priori information with the signs of the extrinsic information, counting the number of the different signs between the a-priori information and the extrinsic information using an OR-operated value and multiplying the counted number of different signs by a compensation value according to quantization of the symbol input to the decoder;

comparing the measurement with the threshold; and outputting the iterative decoding stop command according to the comparison result.

5. The forward error correction method of claim 4, wherein the iterative decoding stop command is output if the measurement exceeds the threshold.

6. The forward error correction method of claim 4, wherein the detecting of the minimum of the absolute reliabilities comprises:

selecting one of an initial value and the minimum absolute reliability of an input symbol;

comparing the absolute reliability with the selected value and outputting a select signal according to a comparison result;

selecting as the minimum absolute reliability the absolute reliability with the selected value according to the select signal; and sequentially measuring the minimum absolute reliabilities of the symbols of the frame and outputting the minimum absolute reliabilities as the measurement.

* * * * *